United States Patent [19]

Blondel et al.

[11] 4,270,224

[45] May 26, 1981

[54] MICROWAVE DOWN CONVERTER

[75] Inventors: Jacques Blondel; Jean-René Mahieu, both of Paris, France

[73] Assignee: Thomson-CSF, Paris, France

[21] Appl. No.: 125,700

[22] Filed: Feb. 28, 1980

[30] Foreign Application Priority Data

Mar. 1, 1979 [FR] France ................................ 79 05345

[51] Int. Cl.³ ............................................. H04B 1/26
[52] U.S. Cl. .................................... 455/327; 333/250; 455/328; 455/330; 455/331
[58] Field of Search ................ 455/323, 325, 326–328, 455/330, 331; 330/4.9; 333/247, 250

[56] References Cited

U.S. PATENT DOCUMENTS

| 3,584,306 | 6/1971 | Spacek | 455/327 |
| 3,842,359 | 10/1974 | Dickens | 330/4.9 |
| 4,000,469 | 12/1976 | McMaster | 455/327 |

Primary Examiner—Marc E. Bookbinder
Attorney, Agent, or Firm—Roland Plottel

[57] ABSTRACT

The converter consists of a waveguide through which passes at right-angles a dielectric wafer for a microstrip. On each side of the waveguide this strip forms a microstrip line section. In the waveguide two chip diodes in series connecting the middles of the large walls of the guide have their common point connected to the strip.

3 Claims, 10 Drawing Figures

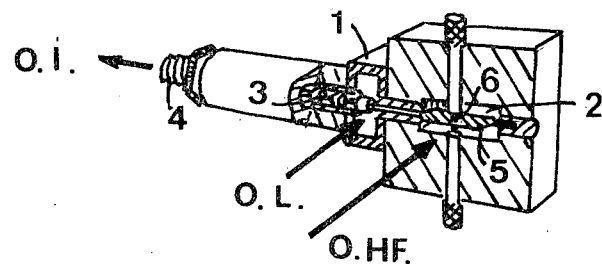
PRIOR ART Fig. 1
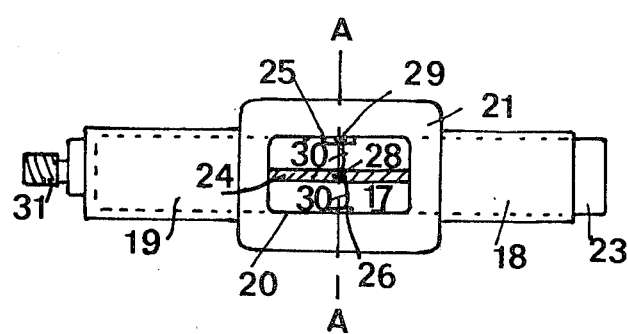
Fig. 2
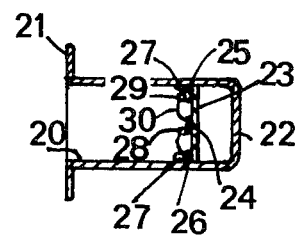
Fig. 4
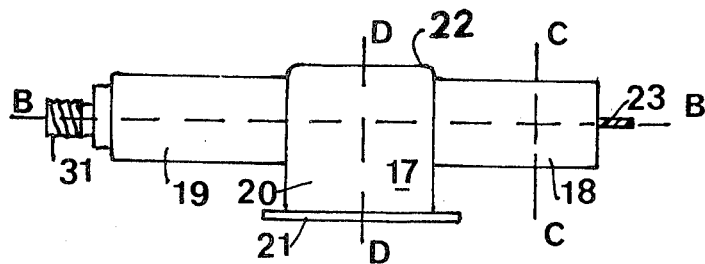
Fig. 3

MICROWAVE DOWN CONVERTER

BACKGROUND OF THE INVENTION

The invention relates to wide pass-band microwave down converters in which the intermediate frequency is low with respect to the frequency of the carrier.

It is known that down converters of this type must be balanced to reduce the effect of the noise of the local oscillator.

It is also known that the decoupling of the three waves present in the down converter, in relation to each other, raises difficulties when the pass-band is wide and when the intermediate frequency is low.

Two solutions to the problem of decoupling the three waves have been proposed in U.S. Pat. Nos. 3,584,306 filed on Sept. 18, 1967 and 3,638,126 filed on Jan. 28, 1972. The synthesis of the basic arrangements disclosed in these two patents is shown in FIG. 1 of the catalogue of SPACE KOM Company. This figure has been reproduced in the present application as prior art. In this down converter, the waveguide 1 is supplied by the local oscillator, the microwave is introduced into cavity 2 constituted by the end of a waveguide terminated by a short-circuit, and the intermediate frequency wave isolated by filter 3 is available at coaxial connector 4. The local wave is introduced into cavity 2 by means of a conductor passing through the waveguide 1 and extending by a flat conductor 5 located in the horizontal median plane of cavity 2.

However, the configuration of the electric field generated by the conductor 5 is symmetrical with respect to said median plane. The cavity 2 can be excited by the local wave because of the presence of two diodes 6 serially connected in the same direction, each diode having an electrode in contact with conductor 5 and an electrode coupled to the waveguide in order to form a dissymmetry between the two components of the field produced by the conductor 5. The beats between the local wave and the microwave appear on conductor 5 because of the non-linearity of diodes 6, and the lower frequency sideband is isolated so as to form the intermediate frequency wave. The structure shown in FIG. 1 is only compatible with diodes mounted in a housing but the latter limits the frequency at which the diodes are used.

SUMMARY OF THE INVENTION

The aim of the invention is a down converter structure adapted for using chip or beam-lead diodes.

The balanced down converter for millimetric waves, according to the invention, consists in a parallelepipedic cavity through which passes a dielectric wafer serving as substrate for a microwave circuit having a conducting strip for connecting two diodes in series in the same direction, each diode being connected to one of the opposite walls of said cavity, said strip belonging to two lengths of microwave line for propagating respectively the beat waves generated in the cavity and for introducing the wave from the local oscillator into the cavity in cooperation with a flat wall parallel to the substrate of two metal cases disposed on each side of the cavity and having one wall parallel to a flange for coupling the cavity to a waveguide in which the incident wave is propagated.

According to a preferred embodiment of the invention, the same conducting strip is used for introducing the wave generated by the local oscillator, for serially connecting the mixing diodes, for forming the active part of a low-frequency filter and for propagating the intermediate frequency wave.

The down converter object of the invention presents the following advantages:
the use of chip diodes permits the operation at millimetric frequencies;
the use of the hybrid technology simplifies the mounting of the diodes and, when chip diodes are used, allows to adjust the connections positionning the substrate in the down converter;
the coupling of the local oscillator is achieved with a negligible increase in the cost of production of the substrate, and the total cost for constructing the down converter is reduced.

BRIEF DESCRIPTION OF DRAWINGS

Other features and advantages of the invention will become apparent from the following description, which is illustrated by the accompanying drawings in which:

FIG. 1 already described relates to the prior art.

FIG. 2 shows the mixer of the invention in elevation.

FIG. 3 shows a top view of the down converter according to the invention.

FIG. 4 shows the mixing cavity in cross-section.

DETAILED DESCRIPTION OF THE INVENTION

Figure 5:
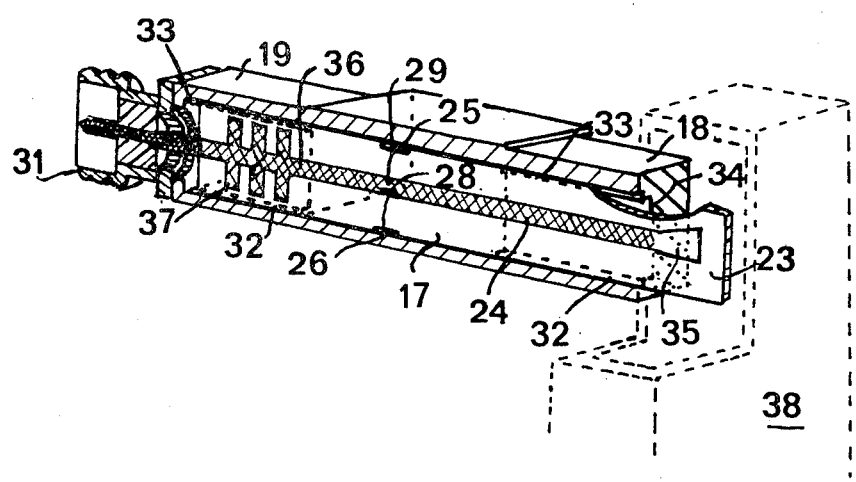
FIG. 5 shows a longitudinal section of the down converter according to the invention.

FIGS. 2, 3 and 4 show the down converter of the invention in elevation, in a top view and in cross-section respectively. The down converter comprises two cases 18 and 19 located at each side of a mixing cavity 17 formed by a portion of a rectangular waveguide 20 which is terminated at a first end by a standard flange 21 for connecting to the microwave circuit and at the other end by a short-circuit 22. The cross-section of the waveguide 20 has its large walls oriented in the longitudinal direction of the down converter and its small walls oriented according to the thickness. An insulating substrate 23, for example made from molten silica, perpendicular to guide 20 and passing through cases 18 and 19, carries a conducting strip 24 obtained by metallization, defining the cross-section of the guide 20 in the middle by passing through the middle of the small walls. The substrate 23 also carries two rectangular metallizations 25 and 26, symmetrical with each other in relation to 24, providing a contact with the side wall of the guide in the middle of one large wall owing to a drop of conducting adhesive 27 deposited after positioning of substrate 23, as it is shown in FIG. 4 illustrating in section the mixing cavity taken along a trace plane AA of FIG. 2.

FIG. 4 shows the use of two chip diodes 28 and 29 whose cathode electrodes are electrically coupled to points 24 and 25, respectively and serially connected by means of two thermocompressed wires 30. The first one of these wires couples the anode electrode of diode 29 to strip 24 and, therefore, to the cathode of diode 28 and the second wire couples the anode electrode of diode 28 to metallization 26. When beam-lead diodes are used, these are directly fixed by thermocompression to metallizations 25 and 26 on the one hand and to the strip 24 on the other. The down converter carries a coaxial microplug 31 on one of its end faces. In FIG. 3, BB shows the trace of the plane of FIG. 5 and CC and DD show the traces of the planes of FIGS. 4 and 6a respectively.

FIG. 5 shows a perspective view of the down converter of the invention in a section along a vertical plane passing just in front of substrate 23. Substrate 23 passes through cases 18 and 19 in the longitudinal direction while abutting against stops 32 and 33 which maintain said substrate at a small distance from wall 34. Strip 24 and wall 34 separated by substrate 23 form a first microwave line section in case 18 terminating with an antenna 35 and in case 19 a second section 36 connected to the input of a low-pass filter 37. Antenna 35 and waveguide 38 coupled to the local oscillator form a transition which has been described in French Pat. No. 2,229,147 filed on May 7, 1973 by the assignee and, therefore, they do not form part of the invention.

Figure 6A:
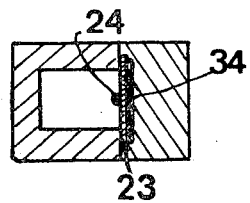
FIG. 6a shows a section of the input microwave line of the local wave.
Figure 6B:
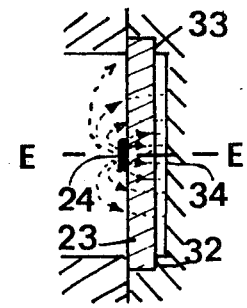
FIG. 6b shows on a larger scale a part of the preceding section.

FIGS. 6a and 6b show case 18 in section along the plane of line CC in FIG. 3. FIG. 6a shows the reciprocal position of the metallization 24 and of the wall 34 of the case which is very close to the back of substrate 23. FIG. 6b on a larger scale than the preceding figure shows the detail of stops 32 and 33 as well as the symmetrical disposition of the electric field lines with respect to a plane along EE perpendicular to the substrate and passing through the middle of strip 24.

Figure 7:
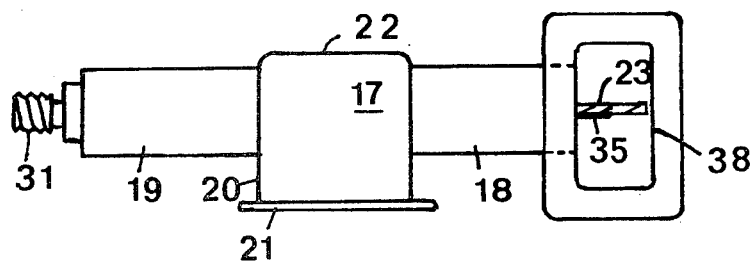
FIG. 7 shows a top view of a preferred embodiment of the invention.

FIG. 7 shows a top view of the preferred embodiment of the invention. The elements already described hereabove have been shown in FIG. 7 with the same references:
the waveguide 20 closed by the short-circuit plane 22 and limited by flange 21 forming the cavity 17;
the cases 18 and 19;
the coaxial microplug 31.
The local wave supply guide 38 is illustrated as turned upwardly in order to show the substrate 23 coming into the immediate vicinity of the wall of waveguide 38. The widened portion 35 of strip 24 forms a wide band transition between guide 38 which penetrates therein and the microstrip constituted by the strip 24, the substrate 23 and the wall 34 of case 18 next to substrate 23.

The down converter of the invention can operate for reception and transmission. In the first case, a wave at frequency $F_o$ penetrates into cavity 17 through guide 20 and a local oscillator, not shown, sends a local wave at frequency $F_{oL}$ into guide 38. The local wave is propagated in the section of microstrip line contained in case 18 according to a TEM mode in which the direction of the electric field, shown in FIG. 6b, is orthogonal to that of the electric field in cavity 17: therefore there can be no direct coupling of the microstrip to cavity 17. The local wave is then propagated along strip 24 located at an equal distance from the two walls of the cavity extending the large walls of waveguide 20. The electric field produced by the local wave is parallel to that of the wave at frequency $F_o$ but is oriented in the same direction as it over one half-height of cavity 17 and in an opposite direction over the other half-height. Diodes 28 and 29 connected in the same direction short-circuit one of the components of the electric field of the local wave and allow the other component to excite a wave at frequency $F_{oL}$ in cavity 17. The two waves respectively at frequency $F_o$ and $F_{oL}$ may then beat and the diodes 28 and 29 cause two components to appear, one at frequency $F_o + F_{oL}$ and the other at frequency $F_o - F_{oL}$. The component at frequency $F_o + F_{oL}$ can pass through neither the low-pass filter 37 nor the waveguide transition since said component is outside the passband in both cases. The component at frequency $F_o - F_{oL} = F_i$ situated in the passband of filter 37 is transmitted by the latter to the coaxial microplug 31.

In transmission operation a wave at frequency $F_i$ is introduced into the down converter through microplug 31. Similarly as to what has already been described, the propagation of the intermediate-frequency wave in microstrip 36 creates a field according to a TEM mode orthogonal to the field in the cavity. The local wave produces in the microstrip contained in case 19 a field according to a TEM mode which is also orthogonal to the field in cavity 17. The local and intermediate-frequency waves are combined in the portion of strip 24 passing through cavity 17 because of the presence of diodes 28 and 29 and the components at frequency $F_o - F_i$ and $F_o + F_i$ are propagated in guide 20. As before, these two waves are decoupled from the intermediate wave and from the local wave.

In both modes of operation, the local wave which only passes through circuits having a low insertion loss and a wide band transmits substantially all the power from the local oscillator to cavity 17. Thus, the conversion losses are small: the power of the local oscillator required is limited, the passband is wide and yet the decoupling of the waves therebetween is excellent although the value of the intermediate frequency is low with respect to that of the high-frequency wave.

By way of illustrative example, a down converter according to the preferred embodiment operating in the frequency band between 33 and 39 GHz has been designed. It comprises two RG 97/U waveguide portions oriented at right angles. The substrate 23 has a thickness equal to 0.3 millimeter, a length equal to 20 millimeters and a width equal to 2,84 millimeters. The strip 24 has a thickness equal to 2 micrometers and a width equal to 0.6 millimeter.

The metallizations 25 and 26 have a width equal to 0.6 millimeter and a length equal to 1 millimeter. The diodes 28 and 29 used are of the beam-lead type reference DC 1308 commercialized by A.E.I. Company Ltd in England.

The power of the wave at frequency $F_{oL}$ required is equal to 13 dBm.

The cutoff frequency of the low-pass filter is equal to 10 GHz.

Figure 8A:
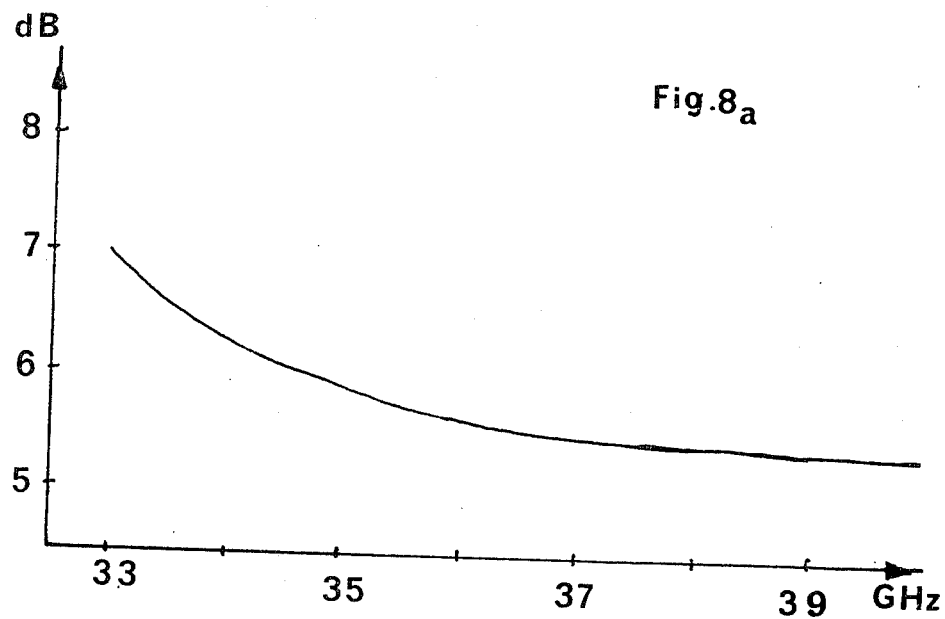
FIGS. 8a and 8b show the curves of variation of the conversion losses of two down converters according to the invention.

The conversion losses vary in the band as shown by the curve in FIG. 8a.

The decoupling between the intermediate-frequency wave and the high-frequency wave is at least equal to 20 dB.

A down converter comprising two RG 99/U waveguide portions and a substrate 23 of a thickness equal to 0.15 millimeter, a length equal to 14,5 millimeters and a width equal to 1,5 millimeter has been designed in the 65–75 GHz band.

The strip 24 carried by the substrate has a width of 0.3 millimeter and the metallizations 25 and 26 have a length of 0.5 millimeter and a width of 0.3 millimeter. The diodes 28 and 29 used are chip diodes developed by THOMSON-CSF Company—FRANCE.

Figure 8B:
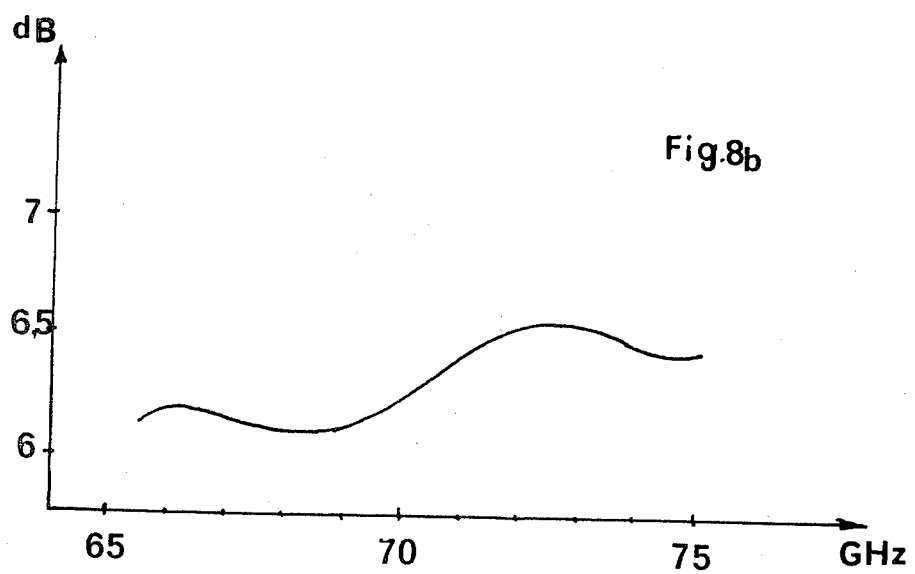

FIG. 8b shows the variation of the conversion losses in the frequency band 65–75 GHz.

What is claimed is:

1. A balanced down converter for millimetric waves delivering a signal at the beat frequency between an input signal and a signal from a local oscillator, comprising:
    a parallelepipedic cavity having first and second opened opposite faces and a third opened face;
    two parallelepipedic housings each of which has an opened face in alignment with one of said two opened opposite faces of said cavity;
    a dielectric wafer serving as substrate for a stripline and passing through said cavity and said two housings, said wafer carrying a conducting strip used for serially connecting two diodes whose non-common electrodes are respectively connected to fourth and fifth opposite faces of said cavity, said strip defining first and second microstrip line sections extending respectively in each of said two housings, said first microstrip line section propagating the signal from the local oscillator towards said cavity, and said second microstrip line section transmitting the beat frequency signal towards an output;
    an approximately flat wall parallel to said wafer and formed by a sixth face of said cavity opposite to said third opened face thereof, and by the corresponding faces of said two housings;
    a flange positioned on said third opened face of said cavity; and
    a guide section connected to said flange for propagating said input signal.

2. A down converter as claimed in claim 1, further comprising a waveguide coupled to said local oscillator, wherein said first microstrip line section is terminated by a widened portion thereof penetrating into said waveguide and forming a wide frequency band transition.

3. The down converter as claimed in claim 2, wherein said second microstrip line forms a low-pass filter.

* * * * *